(12) United States Patent
Chen

(10) Patent No.: US 8,917,560 B1
(45) Date of Patent: Dec. 23, 2014

(54) HALF BIT LINE HIGH LEVEL VOLTAGE GENERTOR, MEMORY DEVICE AND DRIVING METHOD

(71) Applicant: Nanya Technology Corporation, Tao-Yuan Hsien (TW)

(72) Inventor: Chih-Jen Chen, Kaohsiung (TW)

(73) Assignee: Nanya Technology Corporation, Tao-Yuan Hsien (TW)

( * ) Notice: Subject to any disclaimer, the term of this patent is extended or adjusted under 35 U.S.C. 154(b) by 0 days.

(21) Appl. No.: 14/079,613

(22) Filed: Nov. 13, 2013

(51) Int. Cl.
  *G11C 11/40* (2006.01)
  *G11C 11/4094* (2006.01)
  *G11C 7/12* (2006.01)

(52) U.S. Cl.
  CPC ............. *G11C 11/4094* (2013.01); *G11C 7/12* (2013.01)
  USPC ..................................... 365/189.09; 365/154

(58) Field of Classification Search
  CPC ...... G11C 11/4094; G11C 5/147; G11C 7/12; G11C 16/24
  USPC ................................ 365/189.09, 149, 185.23
  See application file for complete search history.

(56) References Cited

U.S. PATENT DOCUMENTS

| | | | |
|---|---|---|---|
| 6,262,910 B1 * | 7/2001 | Takata et al. .................. | 365/145 |
| 6,826,066 B2 * | 11/2004 | Kozaru ........................... | 365/52 |
| 7,697,350 B2 * | 4/2010 | Hsu et al. ................. | 365/189.09 |
| 8,422,270 B2 * | 4/2013 | Kawabata et al. ............ | 365/148 |

* cited by examiner

*Primary Examiner* — Tan T. Nguyen
(74) *Attorney, Agent, or Firm* — CKC & Partners Co., Ltd.

(57) ABSTRACT

A half bit line high level voltage generator, a memory device and a driving method are disclosed herein. The half bit line high level voltage generator includes a control module, a driving module and a detecting module. The control module is configured for generating a first control signal and a second control signal in accordance with an update signal and a half bit line high level voltage. The driving module is configured for generating a half bit line high level voltage to a memory device in accordance with the first control signal and the second control signal. The detecting module is configured for detecting whether a cross current flows through the driving module, and accordingly generating the update signal to adjust the driving module to reduce the cross current.

19 Claims, 10 Drawing Sheets

HALF BIT LINE HIGH LEVEL VOLTAGE GENERTOR, MEMORY DEVICE AND DRIVING METHOD

BACKGROUND

1. Field of Invention

The present invention relates to an integrated circuit. More particularly, the present invention relates to a half bit line high level voltage generator.

2. Description of Related Art

In performing a read/write operation, a memory device, such as a dynamic random access memory (DRAM), is driven by a half bit line high-level voltage (e.g., ½VCC).

The half bit line high level voltage is typically generated from a push-pull type voltage generator. A mismatch or an offset voltage resulting from certain environmental degradations within the push-pull type voltage generator may cause a cross current. The cross current increases a standby current of the memory device, which accordingly consumes more power.

Therefore, a heretofore-unaddressed need exists for reducing the cross current in the memory device to address the aforementioned deficiencies and inadequacies.

SUMMARY

One aspect of the present invention is to provide a half bit line high level voltage generator. The half bit line high level voltage generator includes a control module, a driving module and a detecting module. The control module is configured for generating a first control signal and a second control signal in accordance with an update signal and a half bit line high level voltage. The driving module is configured for generating a half bit line high level voltage to a memory device in accordance with the first control signal and the second control signal. The detecting module is configured for detecting whether a cross current flows through the driving module, and accordingly generating the update signal to adjust the driving module to reduce the cross current.

Another aspect of the present invention is to provide a memory device. The memory device includes a transfer unit, a storage unit and a half bit line high level voltage generator. The transfer unit is configured for selectively transferring a data signal in accordance with a select signal. A first terminal of the storage capacitor is electrically coupled to the transfer unit to store the data signal, a second terminal of the storage capacitor is configured for receiving a half bit line high level voltage. A half bit line high level voltage generator includes a first amplifier, a second amplifier and a detecting module. The first amplifier is configured for generating a first control signal in accordance with a first reference voltage and the half bit line high voltage. The second amplifier is configured for generating a second control signal in accordance with a second reference voltage and the half bit line high voltage, wherein the half bit line high level voltage generator is configured for generating the half bit line high level voltage in accordance with the first control signal and the second control signal. The detecting module configured for detecting an offset voltage generated between the first amplifier and the second amplifier, and accordingly generating an update signal to adjust the half bit line high level voltage generator to reduce the offset voltage.

Yet another aspect of the present invention is to provide a driving method for driving a memory cell. The method in one embodiment includes the following steps: generating a first control signal from a first amplifier; generating a second control signal from a second amplifier; generating a half bit level high voltage in accordance with the first control signal and the second control signal, wherein the half bit level high voltage is configured for driving the memory cell; generating an update signal in accordance with the first control signal and the second control signal; and adjusting the first control signal and the second control signal in accordance with the update signal, thereby reducing a standby current of the memory cell.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
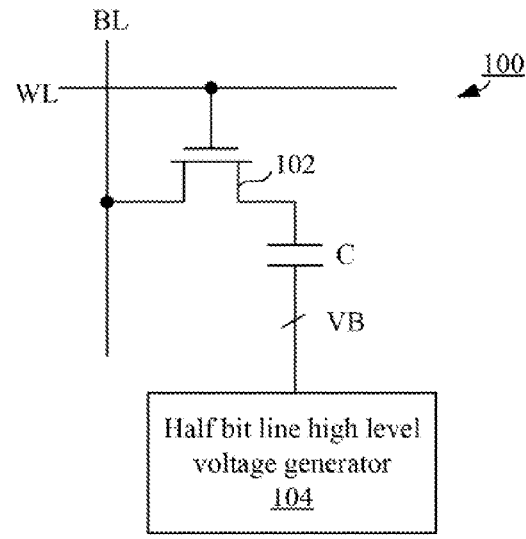
FIG. 1 is a schematic diagram of a memory device in accordance with some embodiments of the present disclosure.

FIG. 1 is a schematic diagram of a memory device in accordance with some embodiments of the present disclosure.

As shown in FIG. 1, the memory device 100 includes a transfer unit 102, a storage capacitor C and a half bit line high level voltage generator 104. The transfer unit is electrically coupled to the a bit line BL and word line WL, and is configured for selectively transferring a data signal transmitted from the bit line BL to the storage capacitor C in accordance with a control signal transmitted from the word line WL.

A first terminal of the storage capacitor C is electrically coupled to the transfer unit 102 to store the data signal. A second terminal of the storage capacitor C is configured for receiving a half bit line high level voltage VB, such as a half of supply voltage (e.g., ½*VCC).

The half bit line level voltage generator 104 is configured for generating the half bit line high level voltage VB. As described above, the mismatch or the offset voltage resulting from the environmental degradations may cause a cross current IC (not shown) at an output terminal of the half bit line level voltage generator 104, which increases the power consumption of the memory device 100.

The following paragraphs will discuss some embodiments about how does the half bit line level voltage generator 104 reduce the cross current IC. For purpose of specification, many details in practice will be described together with the following description. However, it should be understood that these details in practice are not used to limit the disclosure.

Figure 2A:
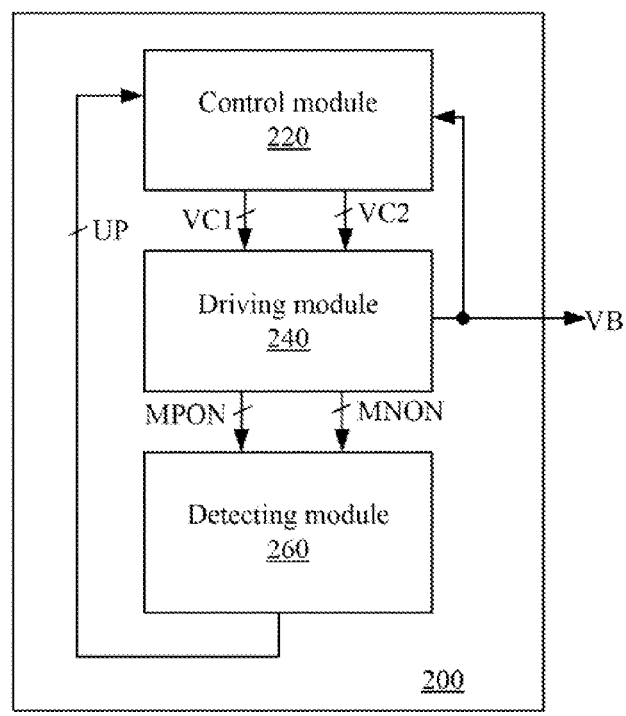
FIG. 2A is a block diagram of a half bit line high level voltage generator in accordance with some embodiments of the present disclosure.

FIG. 2A is a block diagram of a half bit line high level voltage generator in accordance with some embodiments of the present disclosure. As shown in FIG. 2A, the half bit line high level voltage generator 200 includes a control module 220, a driving module 240 and a detecting module 260.

The control module 220 is configured for generating a first control signal VC1 and a second control signal VC2 in accordance with an update signal UP and the half bit line high level voltage VB.

The driving module 240 is configured for generating the half bit line high level voltage VB to the memory device 100 in accordance with the first control signal VC1 and the second control signal VC2.

The detecting module 260 is configured for detecting whether the cross current IC flows through the driving module 240, and accordingly generating the update signal UP to adjust the driving module 240 to reduce the cross current IC.

Figure 2B:
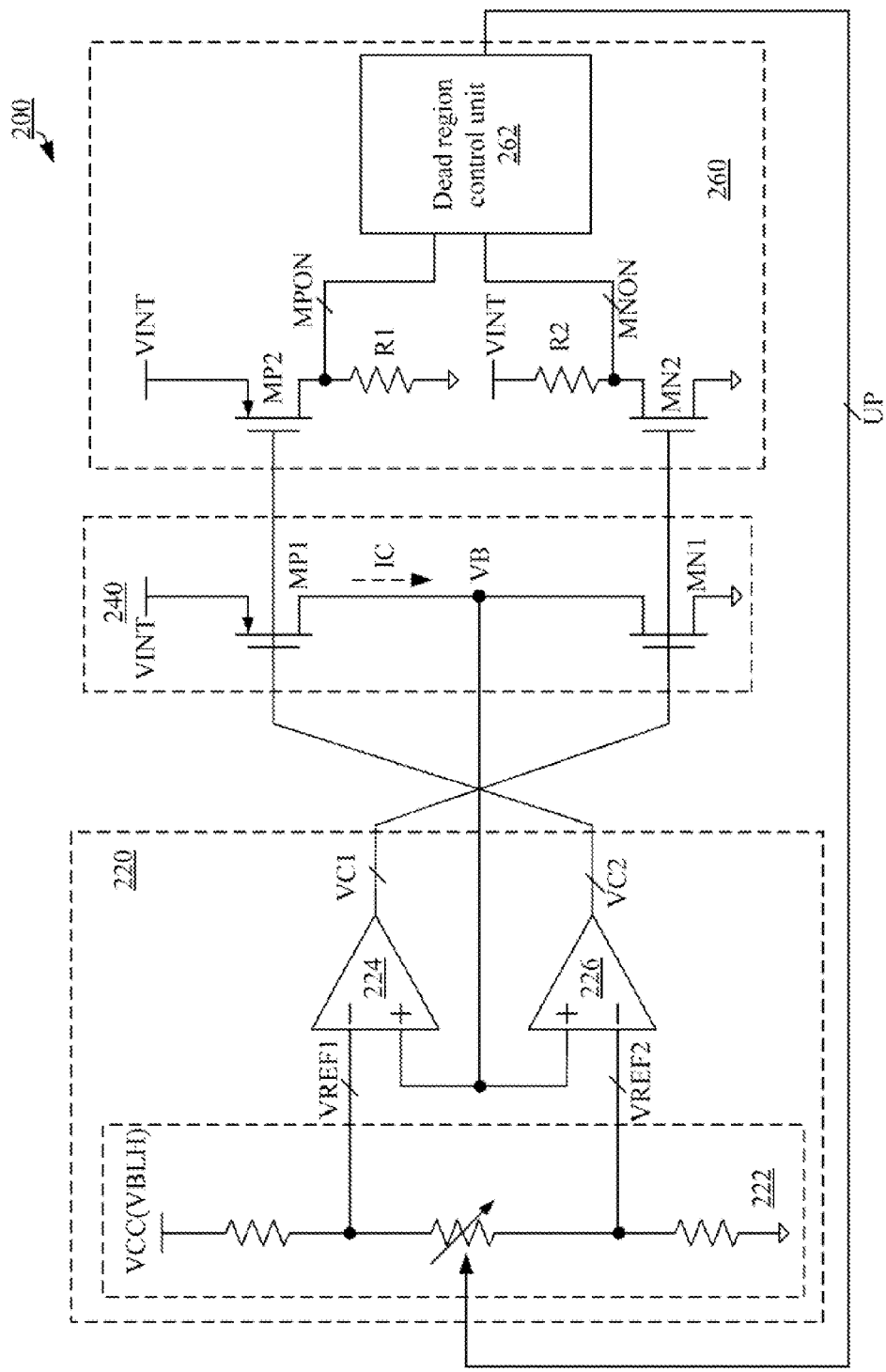
FIG. 2B is a schematic diagram of a half bit line high level voltage generator in accordance with some embodiments of the present disclosure.

FIG. 2B is a schematic diagram of a half bit line high level voltage generator in accordance with some embodiments of the present disclosure.

As shown in FIG. 2B, the driving module 240 includes a first switching unit MP1 and a second switching unit MN1. A first terminal of the first switching unit MP1 is configured for receiving a driving voltage VINT, a second terminal of the first switching unit MP1 is configured for generating the half bit line high level voltage VB, and the control terminal of the first switching unit MP1 is configured for receiving the second control signal VC2. A first terminal of the second switching unit MN1 is electrically coupled to the second terminal of the first switching unit MP1, a second terminal of the second switching unit MN1 is electrically coupled to ground, and a control terminal of the second switching unit MN1 is configured for receiving the first control signal VC1.

In regard to functions of the first switching unit MP1 and the second switching unit MN1, the first switching unit MP1 is configured for selectively turning on in accordance with the second control signal VC2 to generate the half bit line high level voltage VB to an output terminal, such as the second terminal of the first switching unit MP1. The second switching unit MN1 is configured for selectively turning on in accordance with the first control signal VC1 to generate the half bit line high level voltage VB to the output terminal. In normal operation, only one of the first switching unit MP1 and the second switching unit MN1 is turned on to generate the half bit line high level voltage VB.

However, the mismatch or the offset voltage resulting from the environmental degradations may cause that the first switching unit MP1 and the second switching unit MN1 both turned on and thus generates the cross current IC, which flows through the first switching unit MP1 and the second switching unit MN1.

In some embodiments, as shown in FIG. 2B, the control module 220 includes a voltage dividing unit 222, a first amplifier 224 and a second amplifier 226. The voltage dividing unit 222 is configured for generating a first reference voltage VREF1 and second reference voltage VREF2 to respectively drive the first amplifier 224 and the second amplifier 226 in accordance with the update signal UP. The first amplifier 224 is configured for generating the first control signal VC1 in accordance with the first reference voltage VREF1 and the half bit line high level voltage VB. The second amplifier 226 is configured for generating the second control signal VC2 in accordance with the second reference voltage VREF2 and the half bit line high level voltage VB.

It's should be understood that the aforementioned mismatch or the offset voltage may exist between the first amplifier 224 and the second amplifier 226 with an inherent process variation. Therefore, the first amplifier 224 and the second amplifier 226 may generate the incorrect first control signal VC1 and second control signal VC2, and thus both of the first switching unit MP1 and second switching unit MN1 are turned on. Then, the cross current IC will flow through the first switching unit MP1 and second switching unit MN1.

As shown in FIG. 2B, the detecting module 260 includes a first replica switching unit MP2, a second replica switching unit MN2, a first resistive unit R1 and a second resistive unit R2. A first terminal of the first replica switching unit MP2 is configured for receiving to the driving voltage VINT, and the control terminal of the first replica switching unit MP2 is configured for receiving the second control signal VC2. A first terminal of the first resistive unit R1 is electrically coupled to the second terminal of the first replica switching unit MP2, and a second terminal of first resistive unit R1 is electrically coupled to ground. A first terminal of second resistive unit R2 is configured for receiving the driving voltage VINT. A first terminal of the second replica switching unit MN2 is electrically coupled to a second terminal of the second resistive unit R2, a second terminal of the second replica switching unit MN2 is electrically coupled to ground, and a control terminal of the second replica switching unit MN2 is configured for receiving the first control signal VC1.

Further, the size of the first replica switching unit MP2 is same as the size of the first switching unit MP1, and the size of the second replica switching unit MN2 is same as the size of the second switching unit MN1. In order to provide a better matching, the first replica switching unit MP2 and the second replica switching unit MN2 are disposed nearby the first switching unit MP1 and the second switching unit MN1 in a floorplan layout.

In this embodiment, the first replica switching unit MP2 is configured for selectively turning on in accordance with the second control signal VC2. The first resistive unit R1 is electrically coupled to the first replica switching unit MP2 to generate a first detect signal MPON. The second replica switching unit MN2 is configured for selectively turning on in accordance with the first control signal VC1. The second resistive unit R2 is electrically coupled to the second replica switching unit MN2 to generate a second detect signal MNON. Thus, the detecting module 260 can detect the cross current IC in accordance with the first detect signal MPON and the second detect signal MNON.

For example, when the second control signal VC2 is at a low voltage level, the first switching unit MP1 and the first replica switching unit MP2 turn on to generate the first detect signal MPON with a state of logic 1. Similarly, when the first control signal VC1 is at a high voltage level, the second switching unit MN1 and the second replica switching unit MN2 turn on to generate the second detect signal MNON with a state of logic 0. The detecting module 260 can detect that the driving module 240 has cross current IC based on the state of the first detect signal MPON and the second detect signal MNON.

In some embodiments, as shown in FIG. 2B, the detecting module 260 can further include a dead region control unit 262. The term of "dead region" indicates a voltage range which is introduced to prevent the cross current IC at the driving module 240. In other words, when the offset voltage generated between the first amplifier 224 and the second amplifier 226 exceeds the dead region, the driving module 240 generates the cross current IC.

The dead region control unit 262 is electrically coupled to the first terminal of first resistive unit R1 and second terminal of second resistive unit R2 to generate the update signal UP. The dead region control unit 262 is configured for generating the update signal UP in accordance with the first detect signal MPON and the second detect signal MNON.

Figure 2C:
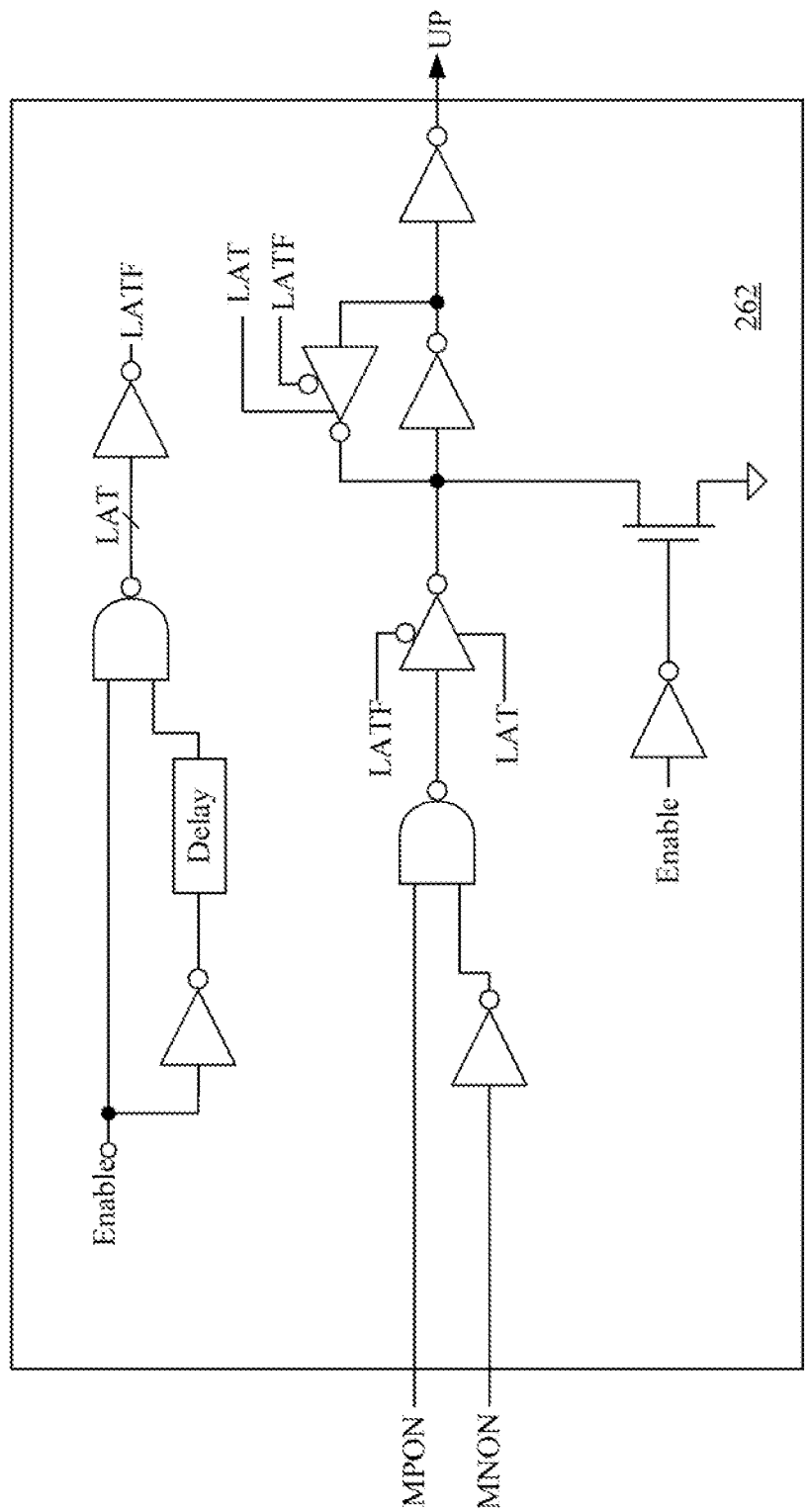
FIG. 2C is a schematic diagram of the dead region control unit in accordance with some embodiments of the present disclosure.

FIG. 2C is a schematic diagram of the dead region control unit in accordance with some embodiments of the present disclosure. As shown in FIG. 2C, when generating the cross current IC, the dead region control unit 262 generates the update signal UP with the state of logic 1. In contrast, when there is no cross current IC at the driving module 240, the dead region control unit 262 generates the update signal UP with the state of logic 0.

Figure 2D:
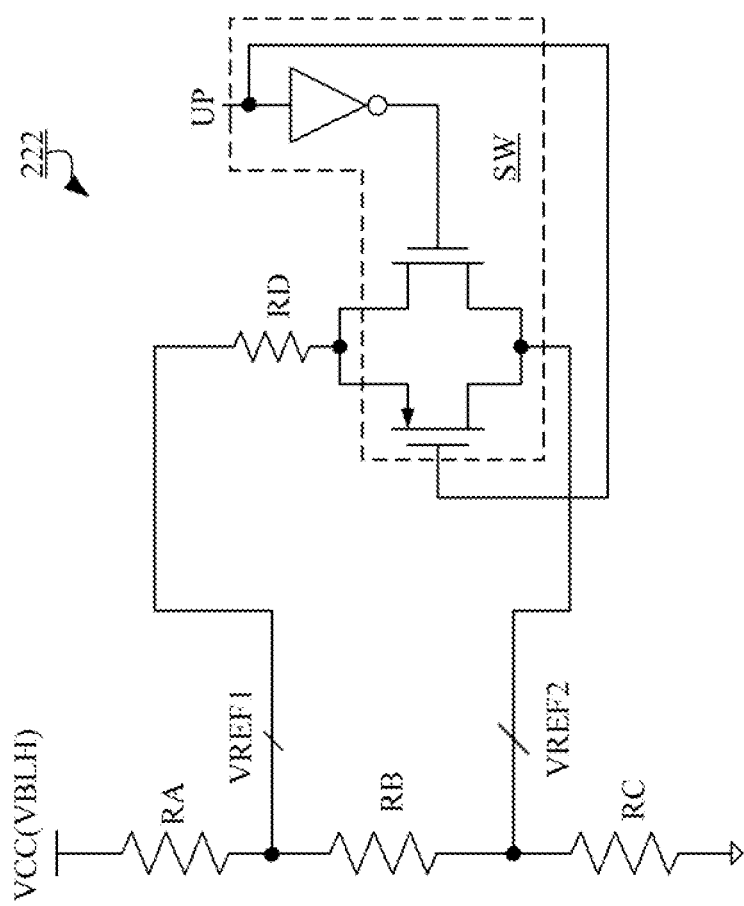
FIG. 2D is a schematic diagram of the voltage dividing unit in accordance with some embodiments of the present disclosure.

FIG. 2D is a schematic diagram of the voltage dividing unit in accordance with some embodiments of the present disclosure.

As shown in FIG. 2D, the voltage dividing unit 222 includes a first resistor RA, a second resistor RB, a third resistor RC, a fourth resistor RD and a switching unit SW. A first terminal of the first resistor RA is configured for receiving a bit line high level voltage VBLH (e.g., VCC), a second terminal of the first resistor RA is configured for generating the first reference voltage VREF1. A first terminal of the second resistor RB is electrically coupled to the second terminal of the first resistor RA, a second terminal of the second resistor RB is configured for generating the second reference voltage VREF2. The third resistor RC is electrically coupled between the second terminal of the second resistor RB and ground. A first terminal of the fourth resistor RD is electrically coupled to the first terminal of the second resistor RB. The switching unit SW is electrically coupled between a second terminal of the fourth resistor RD and the second terminal of the second resistor RB.

The fourth resistor RD and the switching unit SW form a trimming circuit, and the switching unit SW is configured for selectively turning on in accordance with the update signal UP. Thus, the first reference voltage VREF1 and the second reference voltage VREF2 can be adjusted to change the state of the first control signal VC1 and the second control signal VC2, thereby reducing the cross current IC.

Figure 2E:
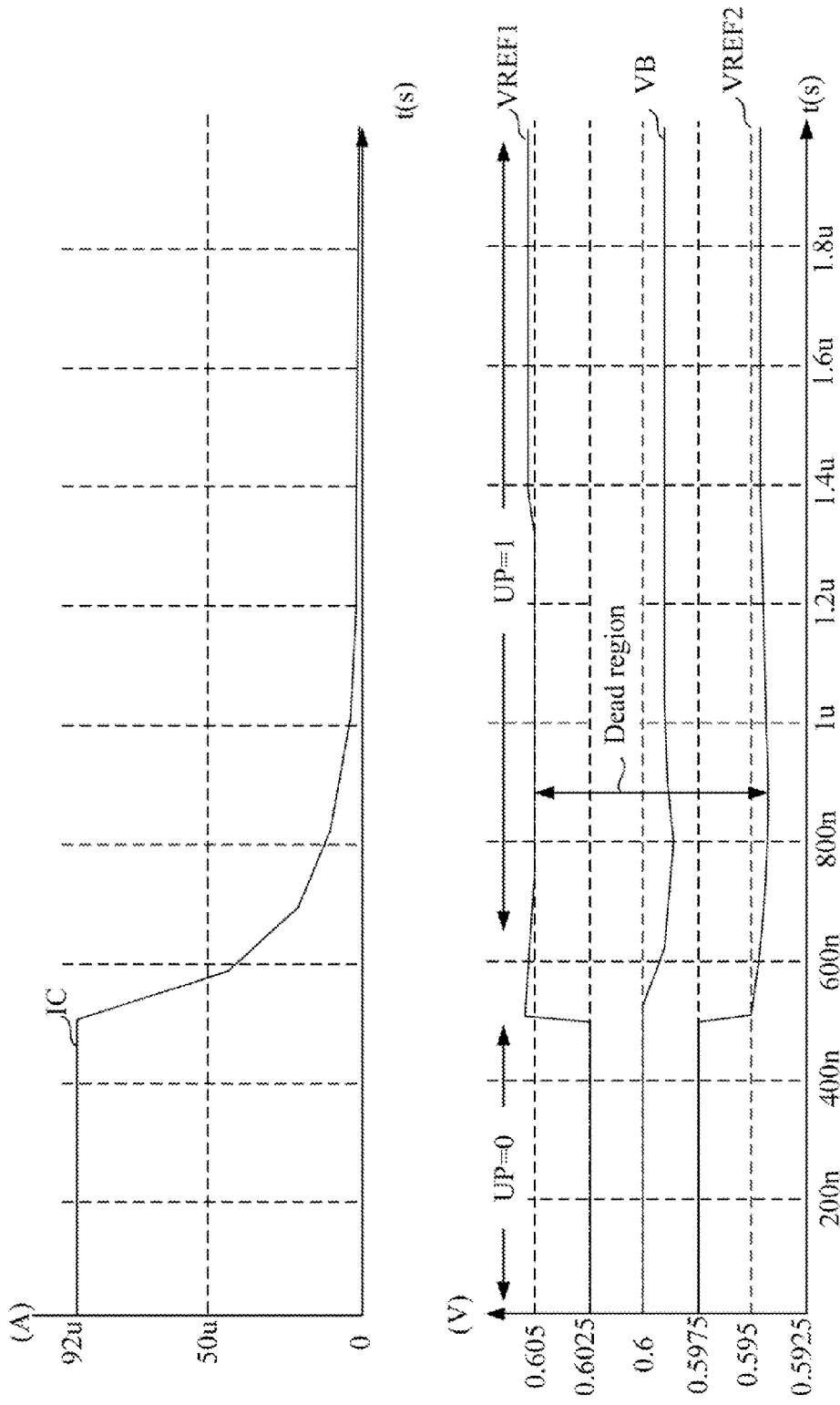
FIG. 2E is a graph of waveforms of the cross current, the update signal, the first reference voltage and the second reference voltage according to one embodiment of the present disclosure.

FIG. 2E is a graph of waveforms of the cross current, the update signal, the first reference voltage and the second reference voltage according to one embodiment of the present disclosure.

In this embodiment, as shown in FIG. 2E, the predetermined half bit high level voltage VB is 0.6V. The offset voltage between the first amplifier 224 and a second amplifier 226 is 6 mV which causes the cross current IC with 92 uA, and thus the state of the update signal UP changes to logic 1 for adjusting the first control signal VC1 and the second control signal VC2. After adjustment, the cross current IC is reduced to 0.2 uA.

Figure 3A:
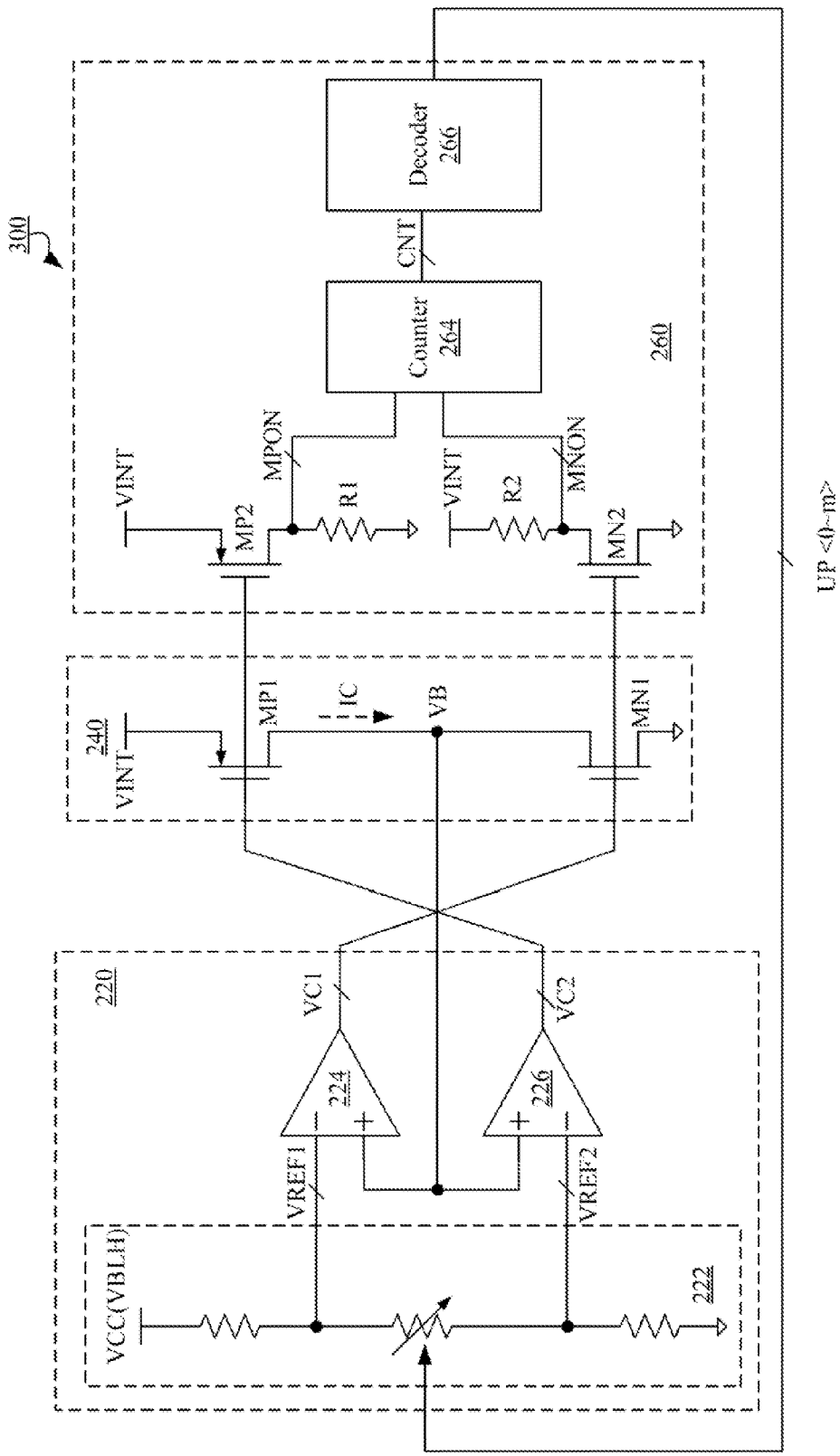
FIG. 3A is a schematic diagram of a half bit line high level voltage generator in accordance with some embodiments of the present disclosure.

FIG. 3A is a schematic diagram of a half bit line high level voltage generator in accordance with some embodiments of the present disclosure. In order to extend the dead region, as shown FIG. 3A, the detecting module 260 includes a counter 264 and a decoder 266.

The counter 264 is electrically coupled to the first terminal of first resistive unit R1 and second terminal of second resistive unit R2 to generate a control digital code CNT. A decoder 266 is electrically coupled to the counter 262 to decode the control digital code CNT to the update signal UP.

In other words, the counter is configured for generating the control digital code CNT in accordance with the first detect signal MPON and the second detect signal MNON. The counter 264 counts up when the cross current IC is detected. The counter 264 stops counting till the cross current IC can be ignored.

The decoder 266 is configured for decoding the control digital code CNT to generate the update signal UP. The update signal UP is a multi-bit signal for controlling a plurality of the trimming circuit.

Figure 3B:
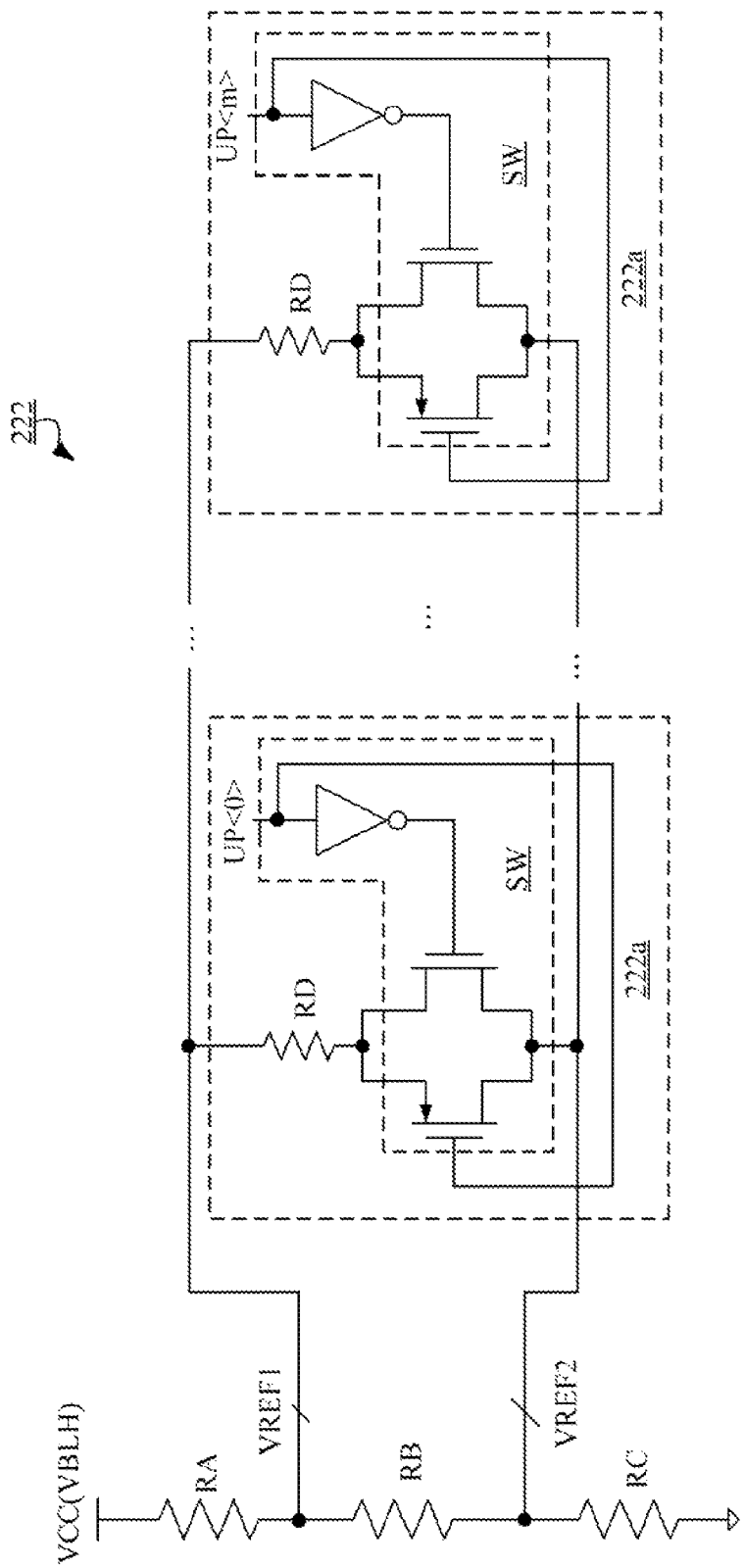
FIG. 3B is a schematic diagram of a voltage dividing unit in accordance with some embodiments of the present disclosure.

FIG. 3B is a schematic diagram of a voltage dividing unit in accordance with some embodiments of the present disclosure. Compared with FIG. 2D, the voltage dividing unit 222 shown in FIG. 3B further includes a plurality of trimming circuits 222a. The trimming circuit 222a is electrically coupled to the second resistor RB in parallel. Each of the trimming circuits 222a includes a fourth resistor RD and a switching unit SW. A first terminal of the fourth resistor RD is electrically coupled to the first terminal of the second resistor RB. The switching unit SW is electrically coupled between a second terminal of the fourth resistor RD and the second terminal of the second resistor RB. The switching unit SW of one of the trimming circuits 222a is configured for selectively turning on in accordance with the corresponding bit of the update signal UP.

In this embodiment, the dead region of the half bit line high level voltage generator 300 can be extended. Therefore, the half bit line high level voltage generator 300 can have better accuracy to reduce the cross current IC.

Figure 3C:
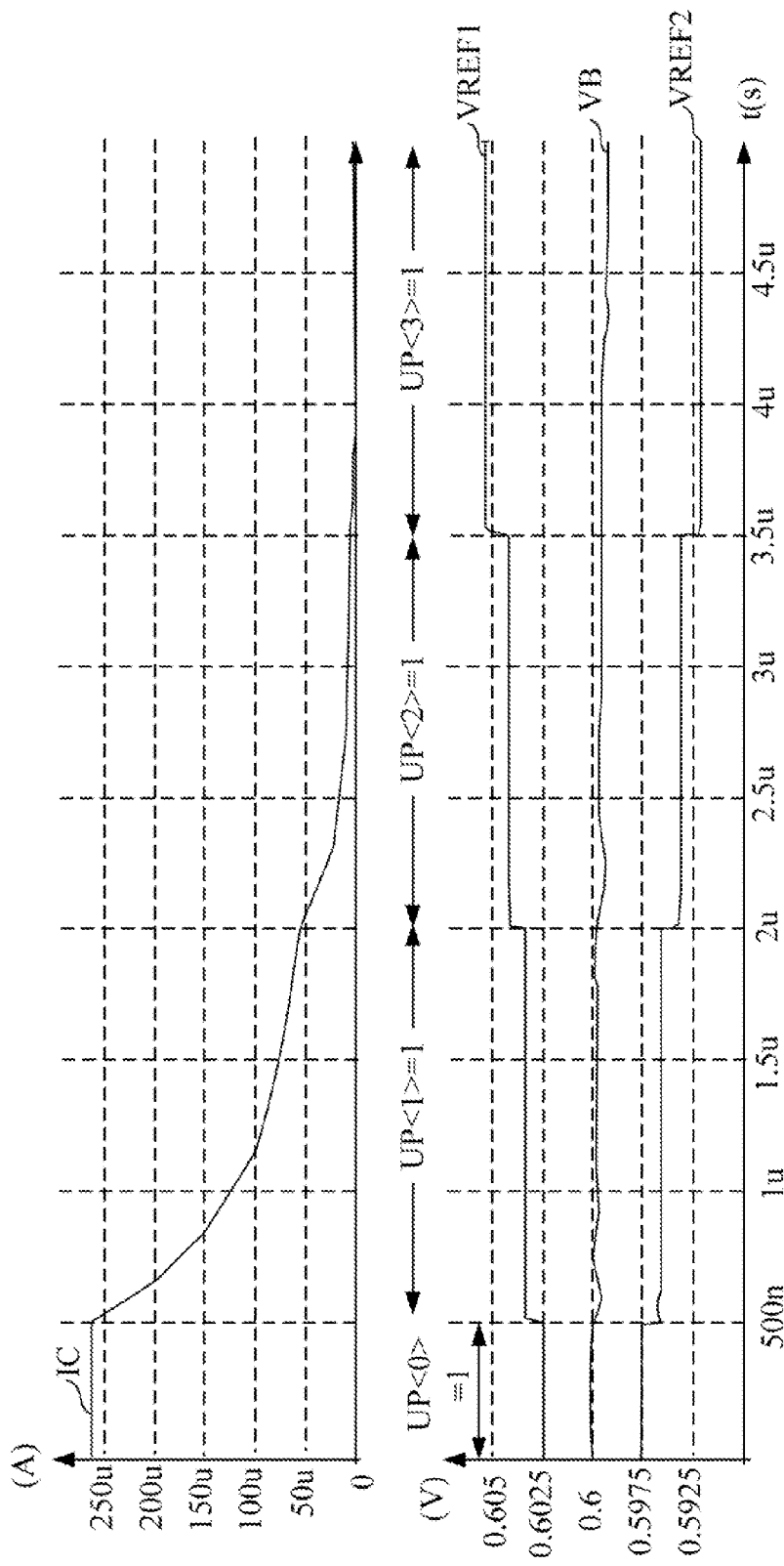
FIG. 3C is a graph of waveforms of the cross current, the first reference voltage and the second reference voltage according to one embodiment of the present disclosure.

FIG. 3C is a graph of waveforms of the cross current, the first reference voltage and the second reference voltage according to one embodiment of the present disclosure.

As shown in FIG. 3C, the predetermined half bit high level voltage VB is 0.6V. The offset voltage between the first amplifier 224 and a second amplifier 226 is 5 mV which causes the cross current IC with 263 uA. After adjusting the dead region step by step, the cross current is less than 1 uA.

Figure 3D:
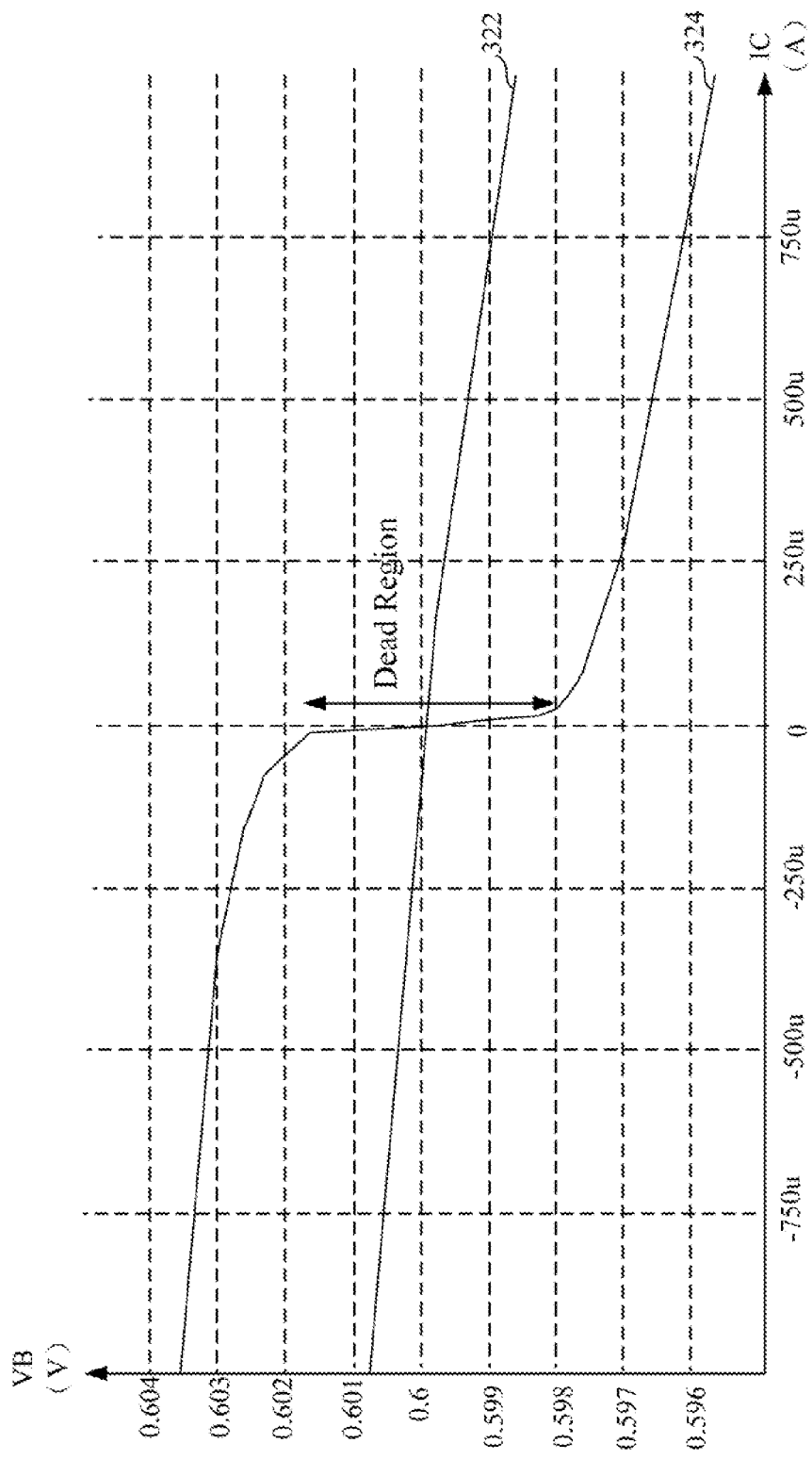
FIG. 3D is a graph of waveforms of the cross current according to one embodiment of the present disclosure.

FIG. 3D is a graph of waveforms of the cross current according to one embodiment of the present disclosure. If the half bit line high level voltage generator 200 is utilized without the detecting module 260, the offset voltage with 7 mV will cause no dead region (e.g. line 322). In contrast, the half bit line high-level voltage generator 200 in the present disclosure with 7 mV offset voltage can have the dead region with 3 mV after adjustment by the detecting module 260 (e.g. line 324).

Further, in a memory array having a plurality of memory cells, each of the memory cells can share the same control module 220 and the driving module 240 with a corresponding detecting module 260. By sharing the same control module 220 and the driving module 240, the area of memory array can be further reduced.

Figure 4:
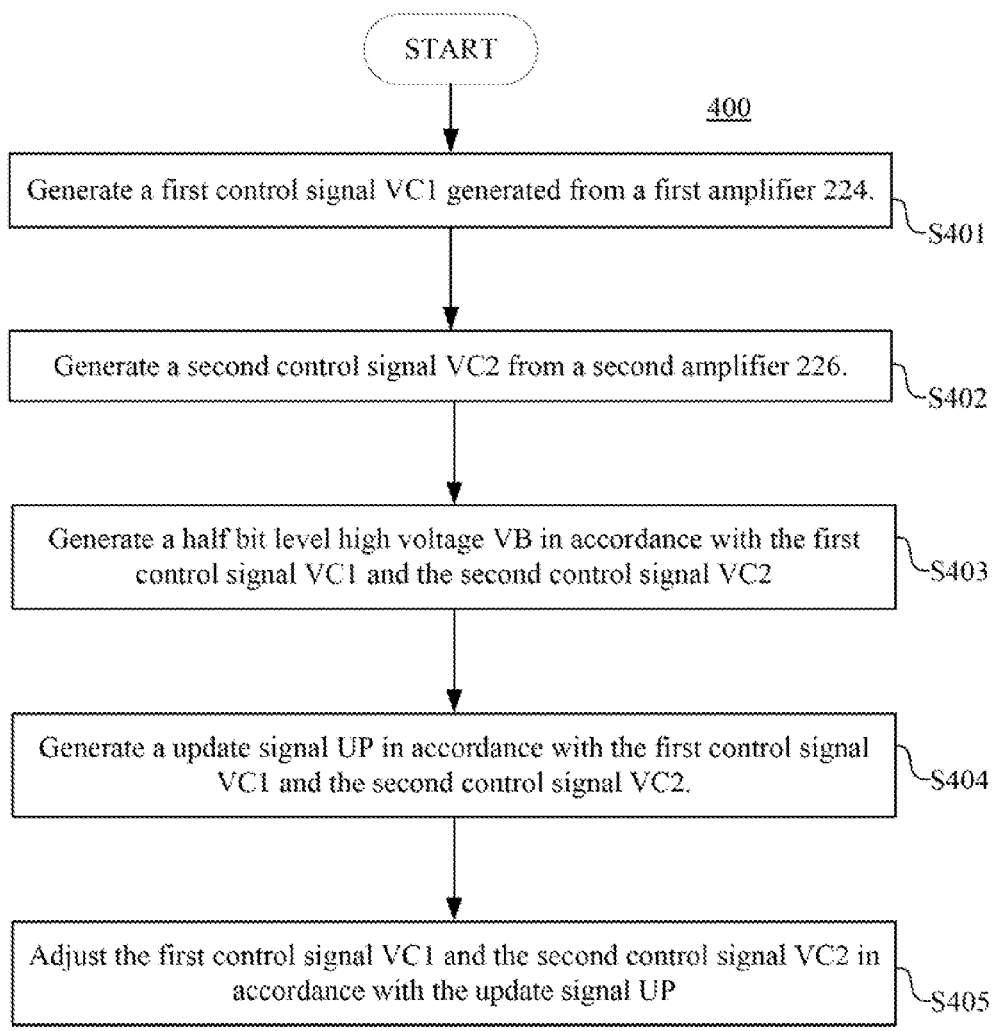
FIG. 4 is a flow chart showing a driving method for driving a memory cell in accordance with some embodiments of the present disclosure.

Another aspect of the present invention provides a driving method for driving a memory cell. FIG. 4 is a flow chart showing a driving method for driving a memory cell in accordance with some embodiments of the present disclosure.

The driving method 400 includes the following steps. Generate a first control signal VC1 from a first amplifier 224. (Step S401) Generate a second control signal VC2 from a second amplifier 226. (Step S402) Generate a half bit level high voltage VB in accordance with the first control signal VC1 and the second control signal VC2, wherein the half bit level high level voltage VB is configured for driving the memory cell. (Step S403) Generate an update signal UP in accordance with the first control signal VC1 and the second control signal VC2. (Step S404) Adjust the first control signal VC1 and the second control signal VC2 in accordance with the update signal UP, thereby reducing a standby current of the memory cell. (Step S405)

Further, in some embodiments of the present disclosure, the first control signal VC1 can be generated by inputting a first reference voltage VREF1 and the half bit level high voltage VB to the first amplifier 224. The second control signal VC2 can be generated by inputting a second reference voltage VREF2 and the half bit level high voltage VB to the second amplifier 226, wherein the first reference voltage VREF1 and the second reference voltage VREF2 are generated from a voltage dividing unit 222.

Hence, this disclosure provides a half bit line high level voltage generator, a memory device and a driving method thereof to reducing the cross current caused by mismatch or offset voltage in the circuitry of the half bit line high level voltage generator, and thus the standby current in the memory device is reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A half bit line high level voltage generator, comprising:
   a control module configured for generating a first control signal and a second control signal in accordance with an update signal and a half bit line high level voltage;
   a driving module configured for generating a half bit line high level voltage to a memory device in accordance with the first control signal and the second control signal; and
   a detecting module configured for detecting whether a cross current flows through the driving module, and accordingly generating the update signal to adjust the driving module to reduce the cross current.

2. The half bit line high level voltage generator of claim 1, wherein the driving module comprises:
   a first switching unit configured for selectively turning on in accordance with the second control signal to generate the half bit line high level voltage to an output terminal; and
   a second switching unit electrically coupled to the first switching unit at the output terminal, wherein the second switching unit is configured for selectively turning on to generate the half bit line high level voltage to the output terminal in accordance with the first control signal, the cross current flows through the first switching unit and the second switching unit when the first switching unit and the second switching both are turned on.

3. The half bit line high level voltage generator of claim 1, wherein the control module comprises:
   a voltage dividing unit configured for generating a first reference voltage and a second reference voltage in accordance with the update signal;
   a first amplifier configured for generating the first control signal in accordance with the first reference voltage and the half bit line high level voltage; and a second amplifier configured for generating the second control signal in accordance with the second reference voltage and the half bit line high level to voltage.

4. The half bit line high level voltage generator of claim 3, wherein the detecting module comprises:
   a first replica switching unit configured for selectively turning on in accordance with the second control signal;
   a first resistive unit electrically coupled to the first replica switching unit to generate a first detect signal;
   a second replica switching unit configured for selectively turning on in accordance with the first control signal; and
   a second resistive unit electrically coupled to the second replica switching unit to generate a second detect signal.

5. The half bit line high level voltage generator of claim 4, wherein the detecting module further comprises:
   a dead region control unit configured for generating the update signal in accordance with the first detect signal and the second detect signal.

6. The half bit line high level voltage generator of claim 5, wherein the voltage dividing unit comprises:
   a first resistor, wherein a first terminal of the first resistor is configured receiving the bit line high level voltage, a second terminal of the first resistor is configured for generating the first reference voltage;
   a second resistor, wherein a first terminal of the second resistor is to electrically coupled to the second terminal of the first resistor, a second terminal of the second resistor is configured for generating the second reference voltage;
   a third resistor, electrically coupled between the second terminal of the second resistor and ground;
   a fourth resistor, wherein a first terminal of the fourth resistor is electrically coupled to the first terminal of the second resistor; and
   a third switching unit electrically coupled between a second terminal of the fourth resistor and the second terminal of the second resistor, wherein the third switching unit is configured for selectively turning on in accordance with the update signal.

7. The half bit line high level voltage generator of claim 4, wherein the detecting module further comprises:
   a counter configured for generating a control digital code in accordance with the first detect signal and the second detect signal; and
   a decoder configured for decoding the control digital code to generate the update signal.

8. The half bit line high level voltage generator of claim 7, wherein the voltage dividing unit comprises:
   a first resistor, wherein a first terminal of the first resistor is configured for receiving the bit line high level voltage, a second terminal of the first resistor is configured to generate the first reference voltage;
   a second resistor, wherein a first terminal of the second resistor is to electrically coupled to the second terminal of the first resistor, a second terminal of the second resistor is configured to generate the second reference voltage;
   a third resistor electrically coupled between the second terminal of the second resistor and ground; and
   a plurality of trimming circuits electrically coupled to the second resistor in parallel, wherein each of the trimming circuits comprises:
      a fourth resistor, wherein a first terminal of the fourth resistor is electrically coupled to the first terminal of the second resistor, and
      a third switching unit, electrically coupled between a second terminal of the fourth resistor and the second terminal of the second resistor, wherein the third switching unit is configured for selectively turning on in accordance with the update signal.

9. A memory device, comprising:
   a transfer unit configured for selectively transferring a data signal in accordance with a select signal;
   a storage capacitor, wherein the first terminal of the storage capacitor is electrically coupled to the transfer unit to store the data signal, the second terminal of the storage capacitor is configured for receiving a half bit line high level voltage; and
   a half bit line high level voltage generator, comprising:
      a first amplifier configured for generating a first control signal in accordance with a first reference voltage and the half bit line high voltage;
      a second amplifier configured for generating a second control signal in accordance with a second reference voltage and the half bit line high voltage, wherein the half bit line high level voltage generator is configured for generating the half bit line high level voltage in accordance with the first control signal and the second control signal; and
      a detecting module configured for detecting an offset voltage generated between the first amplifier and the second amplifier, and accordingly generating an update signal to adjust the half bit line high level voltage generator to reduce the offset voltage.

10. The memory device of claim 9, wherein the half bit line high level voltage generator further comprises:
    a first switching unit, wherein a first terminal of the first switching unit is configured for receiving a driving voltage, a second terminal of the first switching unit is configured for generating the half bit line high level voltage, and a control terminal of the first switching unit is configured for receiving the second control signal; and
    a second switching unit, wherein a first terminal of the second switching unit is electrically coupled to the second terminal of the first switching unit, a second terminal of the second switching unit is electrically coupled to ground, and a control terminal of the second switching unit is configured for receiving the first control signal.

11. The memory device of claim 10, wherein the half bit line high level to voltage generator further comprises:
    a voltage dividing unit configured for generating the first reference voltage and the second reference voltage in accordance with the update signal.

12. The memory device of claim 11, wherein the detecting module comprises:
    a first replica switching unit, wherein a first terminal of the first replica switching unit is configured for receiving the driving voltage, and a control terminal of the first replica switching unit is configured for receiving the second control signal;
    a first resistive unit, wherein a first terminal of first resistive unit is electrically coupled to a second terminal of the first replica switching unit, and a second terminal of first resistive unit is electrically coupled to ground;
    a second resistive unit, wherein a first terminal of second resistive unit is configured for receiving the driving voltage; and
    a second replica switching unit, wherein a first terminal of the second replica switching unit is electrically coupled to the second terminal of the second resistive unit, a second terminal of the second replica switching unit is electrically coupled to ground, and a control terminal of the second replica switching unit is configured for receiving the first control signal.

13. The memory device of claim 12, wherein the detecting module further comprises:
a dead region control unit electrically coupled to the first terminal of first to resistive unit and second terminal of second resistive unit to generate the update signal.

14. The memory device of claim 13, wherein the voltage dividing unit comprises:
a first resistor, wherein a first terminal of the first resistor is configured for receiving a bit line high level voltage, a second terminal of the first resistor is configured for generating the first reference voltage;
a second resistor, wherein a first terminal of the second resistor is electrically coupled to the second terminal of the first resistor, a second terminal of the second resistor is configured for generating the second reference voltage;
a third resistor electrically coupled between the second terminal of the second resistor and ground;
a fourth resistor, wherein a first terminal of the fourth resistor is electrically coupled to the first terminal of the second resistor; and
a third switching unit electrically coupled between a second terminal of the fourth resistor and the second terminal of the second resistor, wherein the third switching unit is configured for selectively turning on in accordance with the update signal.

15. The memory device of claim 12, wherein the detecting module further comprises:
a counter electrically coupled to the first terminal of first resistive unit and second terminal of second resistive unit to generate a control digital code; and
to a decoder electrically coupled to the counter to decode the control digital code to the update signal.

16. The memory device of claim 15, wherein the voltage dividing unit comprises:
a first resistor, wherein a first terminal of the first resistor is configured for receiving a bit line high level voltage, and a second terminal of the first resistor is configured to generate the first reference voltage;
a second resistor, wherein a first terminal of the second resistor is electrically coupled to the second terminal of the first resistor, a second terminal of the second resistor is configured to generate the second reference voltage;
a third resistor electrically coupled between the second terminal of the second resistor and ground; and
a plurality of trimming circuits electrically coupled to the second resistor in parallel, wherein each of the trimming circuits comprises:
a fourth resistor, wherein a first terminal of the fourth resistor is electrically coupled to the first terminal of the second resistor; and
a third switching unit electrically coupled between a second terminal of the fourth resistor and the second terminal of the second resistor, wherein the third switching unit is configured for selectively turning on in accordance with the select signal.

17. A driving method for driving a memory cell, comprising:
generating a first control signal from a first amplifier;
to generating a second control signal from a second amplifier;
generating a half bit level high voltage in accordance with the first control signal and the second control signal, wherein the half bit level high voltage is configured for driving the memory cell;
generating an update signal in accordance with the first control signal and the second control signal; and
adjusting the first control signal and the second control signal in accordance with the update signal, thereby reducing a standby current of the memory cell.

18. The driving method of claim 17, further comprising:
generating the first control signal by inputting a first reference voltage and the half bit level high voltage to the first amplifier; and
generating the second control signal by inputting a second reference voltage and the half bit level high voltage to the second amplifier, wherein the first reference voltage and the second reference voltage are generated from a voltage dividing unit.

19. The driving method of claim 18, wherein the voltage dividing unit comprises at least one trimming circuit, the trimming circuit is configured for adjusting the first reference voltage and the second reference voltage in accordance with the update signal, thereby adjusting the first control signal and the second control signal.

* * * * *